United States Patent [19]
Yoo et al.

[11] Patent Number: 5,856,952
[45] Date of Patent: Jan. 5, 1999

[54] INTEGRATED CIRCUIT MEMORY DEVICES INCLUDING A PLURALITY OF ROW LATCH CIRCUITS AND RELATED METHODS

[75] Inventors: Jei-Hwan Yoo, Kyungki-do; Moon-Hae Son, Seoul, both of Rep. of Korea

[73] Assignee: Samsung Electronics Co., Ltd., Kyungki-do, Rep. of Korea

[21] Appl. No.: 22,791

[22] Filed: Feb. 13, 1998

Related U.S. Application Data

[62] Division of Ser. No. 710,429, Sep. 17, 1996.

[30] Foreign Application Priority Data

Sep. 18, 1995 [KR] Rep. of Korea ............... 30478/1995

[51] Int. Cl.$^6$ ............................................. G11C 8/00
[52] U.S. Cl. ............... 365/230.08; 365/230.03; 365/233; 365/230.06
[58] Field of Search ............... 365/230.01, 189.01, 365/230.03, 230.06, 233

[56] References Cited

U.S. PATENT DOCUMENTS

5,420,869  5/1995  Hatakeyama ............... 371/21.1
5,426,606  6/1995  Takai ............... 365/189.05
5,798,978  8/1998  Yoo et al. ............... 365/230.06

*Primary Examiner*—Viet Q. Nguyen
*Attorney, Agent, or Firm*—Myers Bigel Sibley & Sajovec

[57] ABSTRACT

There is disclosed a semiconductor memory device that has a memory-cell array with memory cells arranged in a matrix, bit-line sense amplifiers connected to bit lines of the memory-cell array, a row address predecoder performing decoding of some of row address signals in response to a system clock, and a plurality of banks having an output line of the row address predecoder in common, includes: a row strobe buffer connected to an external system and producing a first control signal for selecting corresponding banks in response to the system clock, a row address strobe signal, and a bank selection address signal and for controlling generation of a row address sampling control signal; a row address sampling control signal generating circuit producing the row address sampling control signal in a predetermined period of time in response to generation of the first control signal produced by the row strobe buffer in order to control word-line activating and precharging operations; and a row decoder latching an output signal obtained by predecoding a row address with the output signal of the row address sampling control signal generating circuit.

5 Claims, 8 Drawing Sheets

INTEGRATED CIRCUIT MEMORY DEVICES INCLUDING A PLURALITY OF ROW LATCH CIRCUITS AND RELATED METHODS

This application is a division of Ser. No. 08/710,429, filed Sep. 17, 1996.

BACKGROUND OF THE INVENTION

1. Field of the Invention

The present invention relates to a semiconductor memory device. More particularly, it relates to a semiconductor memory device with multibank structure for the purpose of effectively activating and precharging word lines and bit lines.

The present application is based on Korean Application No. 30478/1995 which is incorporated herein by reference.

2. Description of the Related Art

In a central processing unit (CPU) and a memory, the more the number of banks of a dynamic random access memory (DRAM) increases, the more the number of word lines that can be kept in the active state increases. This may raise the page hit ratio of DRAM in case of cache miss thereby reducing the access time. In recent years, there has been a tendency to substitute a DRAM with increased banks in number for a static random access memory SRAM being used as a cache.

FIG. 1 depicts a conventional memory device with multibank structure.

As shown in FIG. 1, each one of four banks 0, 1, 2 and 3 consists of a memory cell array and a bit-line sense amplifier. Row address predecoders 10, 30, 60 and 80 are respectively provided to the banks 0, 1, 2 and 3. The row address predecoders 10, 30, 60 and 80 respectively have output lines 3, 5, 7 and 9. Column decoders 50, 51, 52 and 53 are assigned to each bank 0, 1, 2 and 3, too. Therefore, an increase in the number of the banks causes the size of a chip to be significantly increased, and it is hard to increase the banks in number.

FIG. 2 is a block diagram of a conventional semiconductor memory device with stacked multibank structure in which a plurality of banks have one row address predecoder and its output line in common.

Row address predecoders 10, 30, 60 and 80 and their respective output lines 3, 5, 7 and 9 are used in common for a bank group a (banks a1 to am), a bank group b (banks b1 to bm), a bank group c (banks c1 to cm), and a bank group d (banks d1 to dm). Regarding each word-line enabling/disabling operation and sensing operation of each bit-line sense amplifier, a bank activation in response to an active command of a preceding clock signal from an external system may be disabled by the following clock signal's precharge command given to another bank. Thus, the word-line precharging operation may be performed before the word line is disabled, or the corresponding bit-line sense amplifier may be actuated to perform the sensing operation before the word line is enabled.

SUMMARY OF THE INVENTION

Accordingly, it is an object of the present invention to provide a semiconductor memory device with improved multibank structure in which a row strobe buffer, a row address sampling circuit and a row decoder can effectively control word-line activating/precharging operations and operating time of bit-line sense amplifiers.

It is another object of the present invention to provide a semiconductor memory device with improved multibank structure in which a bit-line sensing enable control signal generating circuit and a row-address sampling control signal generating circuit can effectively control word-line activating/precharging operations and operating time of bit-line sense amplifiers.

In order to realize the above objects, a semiconductor memory device that has a memory-cell array with memory cells arranged in a matrix, bit-line sense amplifiers connected to bit lines of the memory-cell array, a row address predecoder performing decoding of some of row address signals in response to a system clock, and a plurality of banks having an output line of the row address predecoder in common, includes: a row strobe buffer connected to an external system and producing a first control signal for selecting corresponding banks in response to the system clock, a row address strobe signal, and a bank selection address signal and for controlling generation of a row address sampling control signal; a row address sampling control signal generating circuit producing the row address sampling control signal in a predetermined period of time in response to generation of the first control signal produced by the row strobe buffer in order to control word-line activating and precharging operations; and a row decoder latching an output signal obtained by decoding a row address with the output signal of the row address sampling control signal generating circuit.

As another aspect of the present invention, in addition to the above components, the inventive semiconductor memory device may include a circuit for controlling enabling and disabling of the bit-line sense amplifier in response to the first control signal, and producing the bit-line sensing enable control signal that is more delayed than the row address sampling control signal.

BRIEF DESCRIPTION OF THE DRAWINGS

FIG. 1 is a block diagram of a conventional memory device with multibank structure;

FIG. 2 is a block diagram of another conventional semiconductor memory device with stacked multibank structure in which a plurality of banks have one row address predecoder and its output line in common;

FIG. 3 depicts a path for controlling a memory device with multibank structure in accordance with the present invention;

FIG. 4 is a block diagram of bank control signal generating circuits with multibank structure in accordance with the present invention;

FIG. 5 is a circuit diagram of a first control signal generating circuit of FIG. 4;

FIG. 6 is a circuit diagram of a row address sampling control signal generating circuit and a bit-line sensing enable control signal generating circuit of FIG. 4;

FIG. 7 is a circuit diagram of a row address sampling circuit and a row decoder of FIG. 4; and FIG. 8 is a timing diagram of outputs of FIG. 3 at the time of row-activating/precharging the banks.

DETAILED DESCRIPTION OF THE PREFERRED EMBODIMENT

A preferred embodiment of the present invention is now described in detail with reference to the accompanying drawings. Similar reference numerals denote similar parts throughout the specification and drawings.

FIG. 3 depicts a path for controlling a memory device with multibank structure in accordance with the present invention.

As shown in FIG. 3, n banks b1 to bn arranged in the direction of length have a row address predecoder 30 and its output line 5 in common. A column decoder 51 controls the banks b1 to bn. Such a memory device includes row address sampling circuits and row decoders 10 to n0 that are under the control of the respective row address sampling control signals RADSABb1 to RADSABbn; bit-line sense amplifier driving circuits 11 to n1 which respectively generate N-sense amplifier driving signals LANGb1 to LANGbn and P-sense amplifier driving signals LAPGb1 to LAPGbn for controlling the operations of bit-line sense amplifiers of the banks b1 to bn by the control of bit-line sensing enable control signals SAEBb1 to SAEBbn; and word-line driving circuits 12 to n2 which respectively generate word-line driving signals WLi1 to WLin upon receipt of word-line enable driving signals WLEi1 to WLEin that are each output signals of the row address sampling circuits and row decoders 10 to n0.

A synchronous dynamic RAM may be synchronized at a rising edge of an external clock signal to give a row active command to one bank, and then may give a row precharge command to another bank in response to the following external clock signal. Besides, the synchronous dynamic RAM may give a row precharge command at a rising edge of an external clock signal.

As shown in FIG. 3, in case that a plurality of banks, e.g. the banks b1 to bn have in common the row address predecoder 30 and its output line 5, when a row precharge command is given to the bank b2 at the following clock after a row active command has been given to the bank b1, the sensing operation of the corresponding bit-line sense amplifier by the row active command given in response to the preceding clock signal becomes delayed, and the row precharging operation with respect to the other bank can be rapidly performed according to the row precharge command given by the following clock signal. In order to prevent one bank activation in response to the active command of the preceding clock signal from being disabled by the following clock signal's precharge command given to another bank, each bank individually latches an output of the row address predecoder 51 in the sampling method at the time of its row activation, and then generates a word line. Besides, each one of the banks has either a control signal RADSAB for precharging each row address sampling circuit and each row decoder at the time of precharge, or a signal SAEB for controlling the enabling/disabling of each bit-line sense amplifier at the time of its row activation or precharge.

FIG. 4 is a block diagram of bank control signal generating circuits with multibank structure in accordance with the present invention.

Referring to FIG. 4, the bank control signal generating circuits include row address sampling control signal generating circuits 10-1 to 10-n which respectively generate row address sampling control signals RADSABb1 to RADSABbn upon receipt of a first control signal PRb1; bit-line sensing enable control signal generating circuits 11-1 to 11-n that each produce bit-line sensing enable control signals SAEBb1 to SAEBbn upon receipt of the first control signal PRb1; and a row strobe buffer 100 that generates the first control signals PRb1 to PRbn in response to the generation of a complementary row address strobe signal $\overline{RAS}$, a clock signal CLK from an external system, and bank selection address signals BAi (i=0–n).

The above circuits will be described in detail with reference to FIGS. 5, 6 and 7. FIG. 5 is a circuit diagram of the first control signal generating circuit of FIG. 4.

As shown in FIG. 5, the first control signal generating circuit includes an inverter chain 5 with even-numbered inverters for delaying the clock signal CLK for a predetermined period of time and inverting it; NAND gates 10 and 20 that respectively perform a NAND operation with respect to a signal inverted from the complementary row address strobe signal $\overline{RAS}$ by an inverter 3; and an activation switch 80 which is coupled between external supply voltage Vcc and ground Vss, and has an output terminal connected to one of input terminals of the NAND gate 10 so as to be coupled to the external supply voltage Vcc at the time of activating a corresponding word line and to be coupled to the ground Vss at the time of precharging the word line for switching.

The first control signal generating circuit also includes a precharge switch 90 which is coupled between external supply voltage Vcc and ground Vss, and has an output terminal connected to one of input terminals of the NAND gate 20 so as to be coupled to the external supply voltage Vcc at the time of activating a corresponding word line and to be coupled to the ground Vss at the time of precharging the word line for switching; a NAND gate 30 that performs a NAND operation with respect to each input bank selection address signal BAi (i=0–n), and outputs a product to both the NAND gates 10 and 20 by way of an inverter 11; and PMOS transistors 40 and 50 and NMOS transistors 60 and 70 which are coupled in series between external supply voltage Vcc and ground Vss, and have their respective gate terminals connected to the NAND gate 10, the odd-numbered inverter of the inverter chain 5, the NAND gate 20, and the inverter chain 5.

The first control signal generating circuit further includes an inverter chain 7 that latches a signal produced to node n1 between the respective drain terminals of the PMOS transistor 50 and NMOS transistor 60, and an inverter 9 that inverts an output of the inverter chain 7 and produces the first control signal PRbi. The first control signal PRbi attains a logic "high" state at the time of activating a corresponding word line while it is at a logic "low" state at the time of precharging the word line.

FIG. 6 is a circuit diagram of the row address sampling control signal generating circuit and the bit-line sensing enable control signal generating circuit of FIG. 4.

As shown in FIG. 6, the first control signal PRbi is produced as the banks to be activated are determined, and is delayed for a predetermined period of time by the inverters 3 and 5. An inverted output of the first control signal PRbi is applied to one of input terminals of a NOR gate 50. The inverted output is also applied to an inverter chain 7 consisting of even-numbered inverters, and is then delayed for a predetermined period of time to be applied to the other input terminal of the NOR gate 50. The NOR gate 50 performs a NOR operation with respect to the delayed signal. An output signal produced by the NOR gate 50 is delayed by an inverter chain 13, and the inverter chain 13 produces a row address sampling control signal RADSABbi.

This bit-line sensing enable control signal generating circuit includes an inverter chain 9 with odd-numbered inverters for delaying and inverting the output signal of the inverter 5; an inverter chain 11 with even-numbered inverters for delaying an output signal of the inverter chain 9 for a predetermined period of time; a NOR gate 80 for outputting a logical product of each output signal of the inverter chains 9 and 11; and an inverter chain 15 for delaying for a predetermined period of time and inverting the output signal of the NOR gate 80 and for producing a bit-line sensing enable control signal SAEBbi.

The following description relates to the operation of the bit-line sensing enable control signal generating circuit.

In case of activating a corresponding word line, the first control signal PRbi attains a logic "high" state, and this high-level signal is delayed by the inverters 3 and 5 for a predetermined period of time. A high-level output signal of the inverter 5 is applied to the NOR gate 50. The high-level output signal of the inverter 5 is also applied to the inverter chain 7 and delayed thereby for a predetermined period of time. A high-level output signal inverted by the inverter chain 7 is produced to the NOR gate 50, and the NOR gate 50 performs a NOR operation with respect to the high-level output signal of the inverter chain 7 thereby producing a short pulse that attains a logic "low" state. The logic "low"-level signal is delayed by the inverter chain 13 for a predetermined period of time whereby the logic "low" row address sampling control signal RADSABbi is produced.

Further, the high-level output signal of the inverter 5 is applied to the inverter chain 9 and delayed thereby for a predetermined period of time. A high-level output signal of the inverter chain 9 is produced to the NOR gate 50, and is delayed thereby so that a logic "low"-level output signal can be produced to the inverter chain 11. An output of the inverter chain 11 attains a logic "low" state, and is produced to the NOR gate 80. The NOR gate 80 performs a NOR operation with respect to this "low"-level signal, and outputs a "high"-level signal. This "high"-level signal is then delayed for a predetermined period of time and inverted by the inverter chain 15. Therefore, the inverter chain 15 produces the bit-line sensing enable control signal SAEBbi which is at a logic "low" state.

The input first control signal attains a logic "low" state at the time of precharging a corresponding word line. Accordingly, the row address sampling control signal RADSABbi and the bit-line sensing enable control signal SAEBbi are each produced as logic "high"-level ones.

FIG. 7 is a circuit diagram of the row address sampling circuit and the row decoder of FIG. 4.

The row address sampling circuit 500 includes an inverter chain 3 which delays for a predetermined period of time and inverts the row address sampling control signal RADSABbi produced by the row address sampling control signal generating circuit of FIG. 6; a NOR gate 100 that receives the row address sampling control signal RADSABbi and an output signal of the inverter chain 3; and an inverter chain 5 which delays an output signal of the NOR gate 100 for a predetermined period of time.

In the meantime, the row decoder includes an inverter 7 which provides an output signal which is a negation of the input row address sampling control signal RADSABbi; a PMOS transistor 10 which receives the output signal of the inverter 7 through its gate terminal, and has a source terminal connected to external supply voltage Vcc and a drain terminal connected to node n2; and NMOS transistors 20, 30, 40 and 50 that are coupled in series between the node n2 and ground Vss, and respectively have gate terminals receiving row addresses DRAij, DRAk1 and DRAmn produced by the row address predecoder, and an output signal of the inverter chain 5.

The following description relates to the operation of the above circuits.

At the time of activating a corresponding word line, the row address sampling control signal RADSABbi attaining a logic "low" state is input to the row address sampling circuit 500. The signal is delayed for a predetermined period of time, and a short pulse attaining a logic "high" state is produced via the row address sampling circuit 500. When each of the row addresses DRAij, DRAk1 and DRAmn produced by the row address predecoder attains a logic "high" state, the NMOS transistors 20, 30, 40 and 50 are turned on, and the "high"-level signal is produced to the PMOS transistor 10 by the inverter 7. Accordingly, the PMOS transistor 10 is turned off so that the node n2 is at a logic "low" state.

The inverter chain 9 latches an output of the node n2 that attains a logic "low" state, and the inverter chain 11 delays for a predetermined period of time and inverts an output of the inverter chain 9 to produce a word-line enable control signal WLEi attaining a logic "high" state.

At the time of precharging the word line, the row address sampling control signal RADSABbi attaining a logic "high" state is input to the row address sampling circuit 500. The row address sampling circuit 500 is turned on to produce a "low"-level signal to the NMOS transistor 50. The NMOS transistor 5 is turned off, and the "low"-level signal inverted and produced by the inverter 7 is input to the PMOS transistor 10 so that the PMOS transistor 10 is turned on. Therefore, the node n2 attains a logic "low" state which results from a difference between the external supply voltage Vcc and threshold voltage of the PMOS transistor 10. The inverter chain 9 latches an output of the node n2 that attains a logic "high" state, and the inverter chain 11 delays for a predetermined period of time and inverts an output of the inverter chain 9 to produce a word-line enable control signal WLEi attaining a logic "low" state.

FIG. 8 is a timing diagram of outputs of FIG. 3 in accordance with the present invention at the time of row activating/precharging the banks.

The reference letter CLK denotes a system clock signal and the row address sampling control signals RADSABb1 and RADSABb2 are enabled to attain logic "low" states each by the first control signals PRb1 and PRb2 in response to row active commands of clock signals 2 and 3 so that a valid row address is produced to the output line of the row address predecoder. Subsequently, a pulse attaining a logic "high" state is produced by the row address sampling circuit 500 of FIG. 7 to make the corresponding word-line enable control signal WLEi attain a logic "high" state so that the corresponding address' word line is at a logic "high" state.

Responding to the clock signals 2 and 3, bit-line sensing enable signals SAEBb1 and SAEBb2 are more delayed than the signal WLEi by the signals PRb1 and PRb2, and are enabled to be at logic "low" states each to make the N/P sense amplifier driving signals LANG and LAPG be at logic "high" and "low" states each thereby starting the sensing action.

When a row precharge command is given in response to clock signals 1 and 4, each first control signal PRb1 and PRb2 attains a logic "low" state, and each one of the signals PADSABb1 and PADSABb2 becomes at a logic "high" state by these signals PRb1 and PRb2 so that the row decoder is precharged to a logic "high" level. Each signal WLEi1 and WLEi2 is disabled to be at a logic "low" state, and the corresponding word line WLi becomes disabled to be at a logic "low" state. Besides, each bit-line sensing enable signal SAEBb1 and SAEBb2 attains a logic "high" state by the "low"-level first control signals PRb1 and PRb2, and the N/P sense amplifier driving signals LANG and LAPG are at logic "low" and "high" states each thereby disabling the bit-line sense amplifier.

In accordance with the present invention, a semiconductor memory device in which a plurality of the banks have one row address predecoder and its output line in common, may effectively control the word-line activating/precharging operations and the operating time of bit-line sense amplifiers, thereby ensuring a reduction in the access time.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. An integrated circuit memory device comprising:

a plurality of memory banks wherein each of said memory banks includes a plurality of memory cells, a plurality of bit lines running along said memory cells, and a bit line sense amplifier connected to said bit lines for sensing and amplifying data of said memory cells;

a row address predecoder which decodes row address signals in response to a system clock;

a row strobe buffer which generates a control signal selecting corresponding memory banks in response to said system clock, a row address strobe signal, and a bank selection address signal;

at least one row address sampling control circuit which generates a row address sampling control signal in a predetermined period of time in response to said first control signal wherein said row address sampling control signal controls word-line activating and precharging operations; and a row decoder which latches a decoded row address signal generated by said row address predecoder in response to said row address sampling control signal.

2. An integrated circuit memory device according to claim 1 wherein said at least one row address sampling control circuit comprises a plurality of row address sampling control circuits each corresponding to a respective memory bank.

3. An integrated circuit memory device according to claim 1 wherein said row strobe buffer comprises:

an activation switch which controls said control signal so that said control signal having a logic "high" state can be generated during word-line activation; and a precharge switch which controls said control signal so that said control signal having a logic "low" state can be generated during word-line precharging operation.

4. An integrated circuit memory device according to claim 1 wherein said row address sampling control circuit produces said row address sampling control signal during said word-line precharging operation to precharge a corresponding word line by a word-line enable signal, and to disable a bit-line sensing enable control signal.

5. An integrated circuit memory device comprising:

a plurality of memory banks wherein each of said memory banks includes a plurality of memory cells, a plurality of bit lines running along said memory cells, and a bit line sense amplifier connected to said bit lines for sensing and amplifying data of said memory cells;

a row address predecoder which decodes row address signals in response to a system clock;

a row strobe buffer which generates a control signal to select a corresponding memory bank in response to a system clock, a row address strobe signal, and a bank selection address signal;

a row address sampling control circuit which generates a row address sampling control signal in a predetermined period of time in response to said control signal generated by said row strobe buffer to control word-line activating and precharging operations; and a bit-line sensing enable control circuit which regulates enabling and disabling of a bit-line sense amplifier in response to said control signal, and which generates a bit-line sensing enable control signal which is delayed after said row address sampling control signal.

* * * * *

UNITED STATES PATENT AND TRADEMARK OFFICE
CERTIFICATE OF CORRECTION

PATENT NO.   : 5,856,952
DATED        : January 5, 1999
INVENTOR(S)  : Yoo et al.

It is certified that error appears in the above-identified patent and that said Letters Patent is hereby corrected as shown below:

Title page,
The title page should be deleted to appear as per attached title page.

Columns 1-8,
Please delete columns 1-8 and substitute columns 1-8 as per attached.

Signed and Sealed this

Twenty-sixth Day of November, 2002

Attest:

Attesting Officer

JAMES E. ROGAN
Director of the United States Patent and Trademark Office

United States Patent [19]
Yoo et al.

[11] Patent Number: 5,856,952
[45] Date of Patent: Jan. 5, 1999

[54] INTEGRATED CIRCUIT MEMORY DEVICES INCLUDING A PLURALITY OF ROW LATCH CIRCUITS AND RELATED METHODS

[75] Inventors: Jei-Hwan Yoo, Kyungki-do; Moon-Hae Son, Seoul, both of Rep. of Korea

[73] Assignee: Samsung Electronics Co., Ltd., Kyungki-do, Rep. of Korea

[21] Appl. No.: 22,791

[22] Filed: Feb. 13, 1998

Related U.S. Application Data

[62] Division of Ser. No. 710,429, Sep. 17, 1996.

[30] Foreign Application Priority Data

Sep. 18, 1995 [KR] Rep. of Korea ............ 30478/1995

[51] Int. Cl.$^6$ ................................................ G11C 8/00
[52] U.S. Cl. ....................... 365/230.08; 365/230.03; 365/233; 365/230.06
[58] Field of Search ................. 365/230.01, 189.01, 365/230.03, 230.06, 233

[56] References Cited

U.S. PATENT DOCUMENTS

| | | | |
|---|---|---|---|
| 5,420,869 | 5/1995 | Hatakeyama | 371/21.1 |
| 5,426,606 | 6/1995 | Takai | 365/189.05 |
| 5,798,978 | 8/1998 | Yoo et al. | 365/230.06 |

*Primary Examiner*—Viet Q. Nguyen
*Attorney, Agent, or Firm*—Myers Bigel Sibley & Sajovec

[57] ABSTRACT

An integrated circuit memory device includes a plurality of memory banks wherein each of the memory banks includes a plurality of memory cells, a plurality of bit lines running along the memory cells, and a bit line sense amplifier connected to the bit lines which senses and amplifies data of the memory cells. A row address predecoder corresponds to the plurality of memory banks, and the row address predecoder decodes row address signals in response to a system clock. A row strobe buffer generates control signals selecting respective memory banks responsive to the system clock, a row address strobe signal, and a bank selection address signal. Each of a plurality of row address sampling control circuits corresponds to a respective memory bank, and each respective row address sampling control circuit generates a row address sampling control signal in response to a respective control signal. Each of a plurality of row latch circuits corresponds to a respective memory bank and a respective row address sampling control circuit, and a respective row latch circuit latches the decoded row address signals responsive to a respective row address sampling control signal generated by a respective row address sampling control circuit. The respective row latch circuit generates a word line enable signal in response to the respective row address sampling control signal and the latched decoded row address.

5 Claims, 8 Drawing Sheets

INTEGRATED CIRCUIT MEMORY DEVICES INCLUDING A PLURALITY OF ROW LATCH CIRCUITS AND RELATED METHODS

This application is a division of Ser. No. 08/710,429 filed Sep. 17, 1996.

FIELD OF THE INVENTION

The present invention relates to the field of integrated circuits and more particularly to integrated circuit memory devices.

BACKGROUND OF THE INVENTION

In a data processing system including a central processing unit (CPU) and memory, the number of word lines that can be kept in an active state can be increased by increasing the number of banks of dynamic random access memory (DRAM). Accordingly, the page hit ratio of a DRAM can be increased in the case of cache miss, thereby reducing access times. There have thus been efforts to substitute dynamic random access memories with increased memory banks for static random access memories in cache applications.

Figure 1:
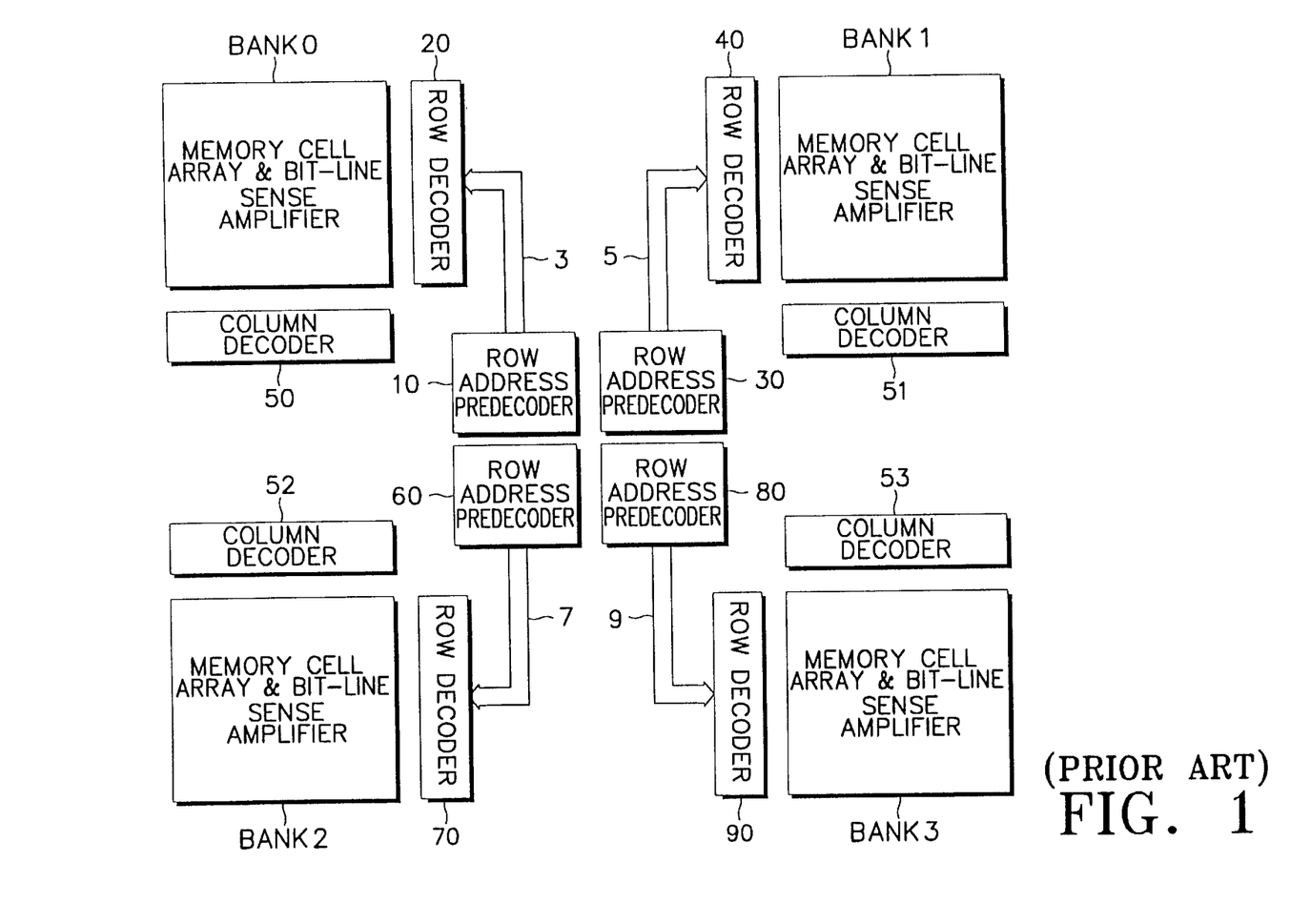
FIG. 1 is a block diagram illustrating a memory device with a multibank structure according to the prior art.

A conventional memory device having a multibank structure is illustrated in FIG. 1. This memory device includes four memory banks BANK0–3, and each of these memory banks includes a memory cell array and a bit-line sense amplifier. The row address predecoders 10, 30, 60 and 80 are respectively provided to the memory banks BANK0–3. The row address predecoders 10, 30, 60 and 80 have respective output lines 3, 5, 7 and 9. The column decoders 50, 51, 52 and 53 are respectively assigned to memory banks BANK0–3. Accordingly, an increase in the number of memory banks may result in a significant increase in the chip size, and it may thus be difficult to increase the number of memory banks.

Figure 2:
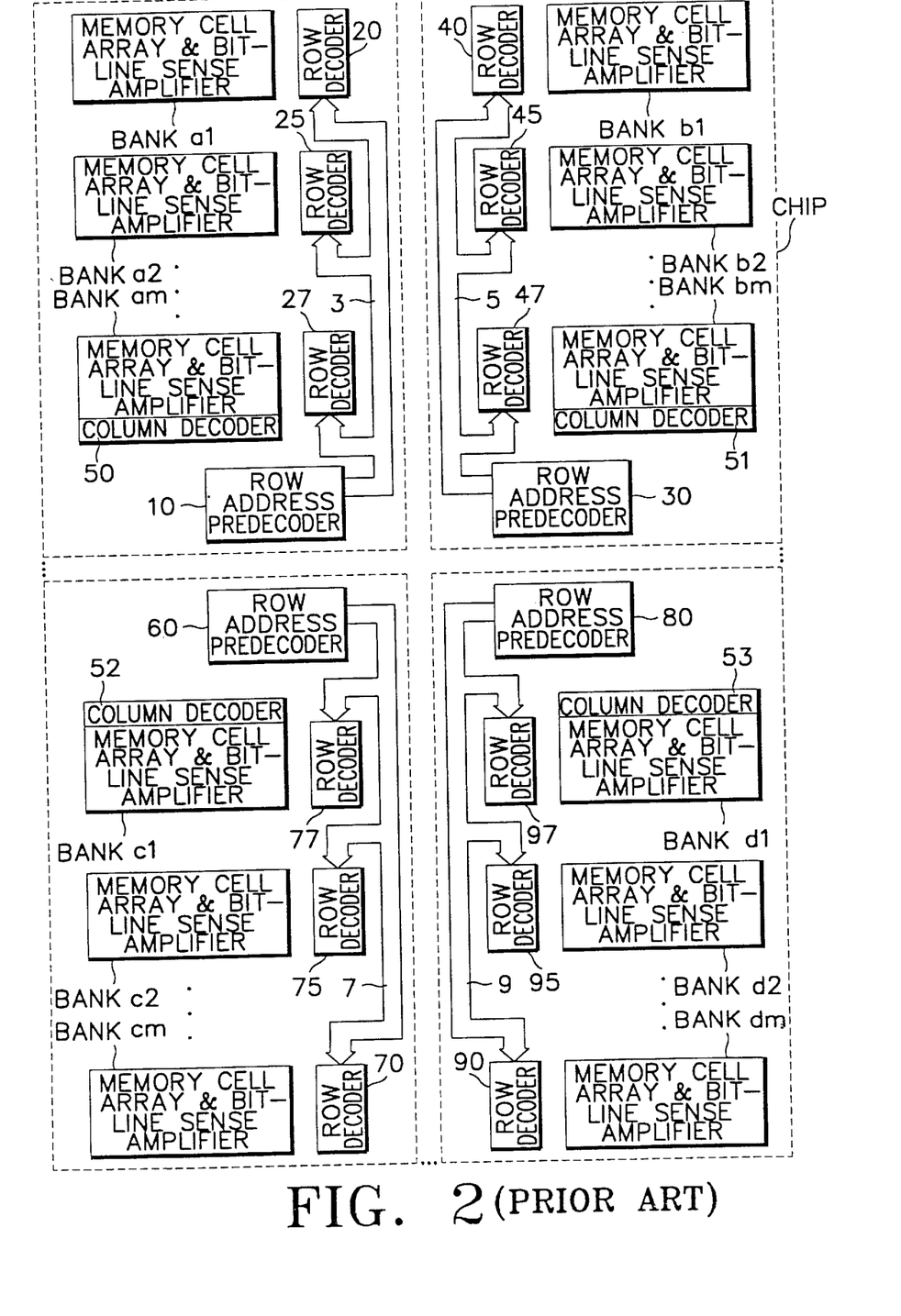
FIG. 2 is a block diagram of an integrated circuit memory device with a stacked multibank structure according to the prior art.

FIG. 2 is a block diagram of a conventional integrated circuit memory device with a stacked multibank structure wherein a plurality of memory banks have a single row address predecoder. As shown, the output of each row address predecoder is shared with a plurality of memory banks. In particular, the output line 3 of row address predecoder 10 is provided to memory banks BANKa1-m, output line 5 of row address predecoder 30 is provided to memory banks BANKb1-m, output line 7 of row address predecoder 60 is provided to memory banks BANKc1-m, and output line 9 of row address predecoder 80 is provided to memory banks BANKd1-m.

During a word line enabling/disabling operation and a sensing operation of a bit line sense amplifier, a bank activation response to an active command of a preceding clock signal from an external system may be disabled by the following clock signal's precharge command provided, to another bank. Thus, the word line precharging operation may be performed before the word line is disabled, or a corresponding bit line sense amplifier may be actuated to perform the sensing operation before the word line is enabled.

SUMMARY OF THE INVENTION

It is therefore an object of the present invention to provide improved integrated circuit memory devices and related methods.

It is another object of the present invention to provide integrated circuit memory devices having reduced access times and related methods.

These and other objects are provided according to the present invention by integrated circuit memory devices comprising a plurality of memory banks wherein each of the memory banks includes a plurality of memory cells, a plurality of bit lines running along the memory cells, and a bit line sense amplifier connected to the bit lines which senses and amplifies data of the memory cells. In particular, a row address predecoder corresponding to the plurality of memory banks decodes row address signals in response to a system clock, and a row strobe buffer generates control signals selecting respective banks responsive to the system clock, a row address strobe signal, and a bank selection address signal.

Each of a plurality of row address sampling control circuits corresponds to a respective memory bank, and each respective row address sampling control circuit generates a row address sampling control signal in response to a respective control signal. Each of a plurality of row latch circuits corresponds to a respective memory bank and a respective row address sampling control circuit. A respective row latch circuit latches the decoded address signals responsive to a respective row address sampling control signal generated by a respective row address sampling control circuit. Each respective row latch circuit generates a word line enable signal in response to the respective row address sampling control signal and the latched decoded row address.

In addition, the row address sampling control signal can be delayed a predetermined period of time after the control signal is generated. The integrated circuit memory device may also include a plurality of bit line sensing control circuits and a plurality of amplifier driving circuits. Each of the bit line sensing control circuits corresponds to a respective memory bank, and each respective bit line sensing control circuit generates a bit line sensing enable control signal in response to a respective control signal. Each of the amplifier driving circuits corresponds to a respective memory bank and a respective bit line sensing control signal, and each respective amplifier driving circuit generates an amplifier driving signal which controls a bit line sense amplifier responsive to the bit line sensing enable control signal. Furthermore, the bit line sensing enable control signal can be delayed for a predetermined period of time after the row address sensing control signal.

According to an alternate aspect of the present invention, a method for operating an integrated circuit memory device includes the steps of decoding row address signals in response to a system clock, and generating control signals which select respective memory banks responsive to the system clock, a row address strobe signal and a bank selection address signal. A row address sampling control signal is generated in response to a respective control signal, and the decoded row address signals are latched responsive to the row address sampling control signal. A word line enable signal is generated in response to the respective row address sampling control signal and the latched decoded row address.

The memory devices and methods of the present invention can thus provide reduced memory access times.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 3:
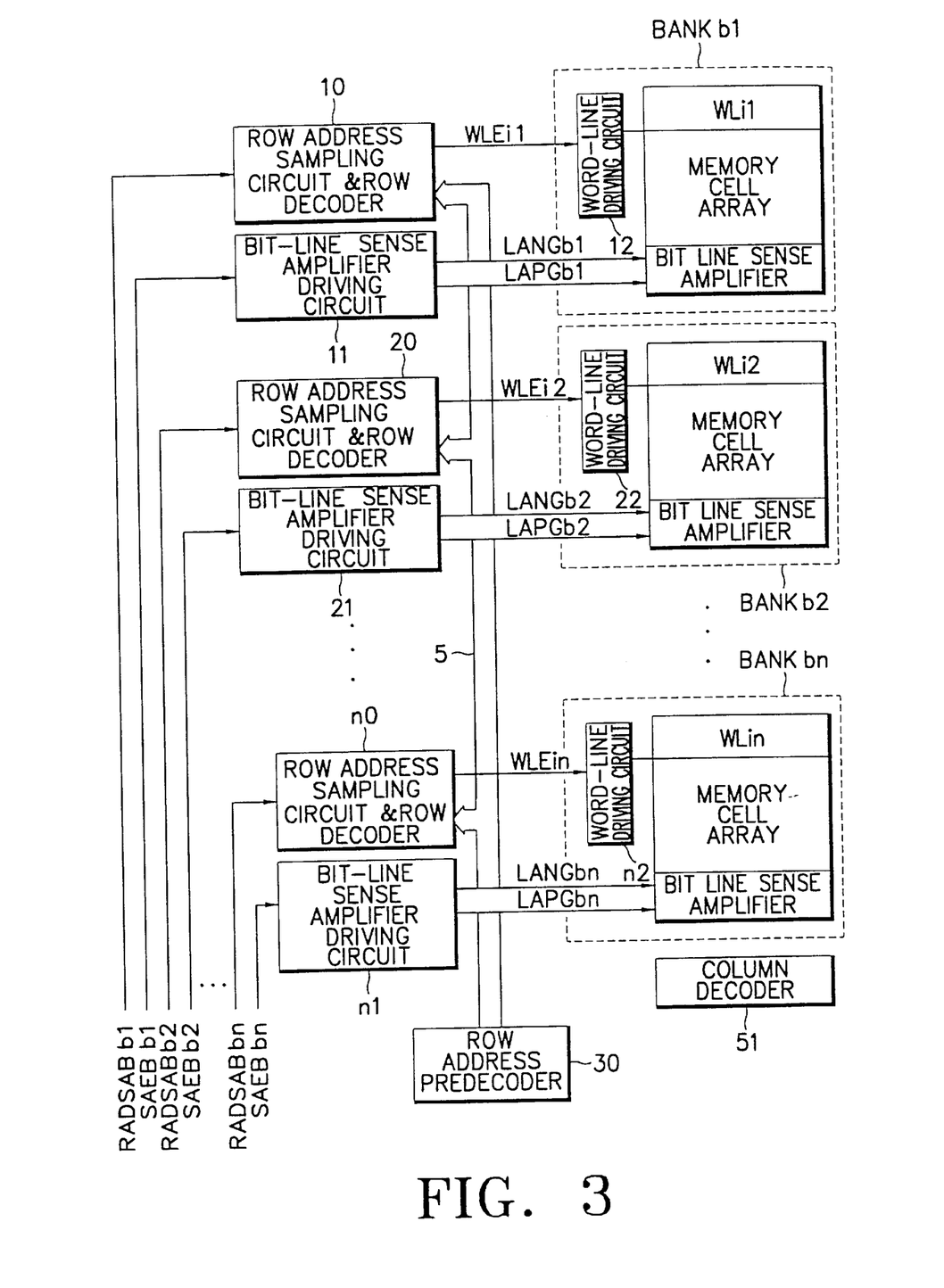
FIG. 3 is a block diagram illustrating an integrated circuit memory device having a multibank structure according to the present invention.

FIG. 3 is a block diagram illustrating an integrated circuit memory device having a multibank structure according to the present invention. As shown, a plurality of memory banks BANKb1-n are arranged in a line and share the row address predecoder 30 and its output line 5. A column decoder 51 controls the banks BANKb1-n. The row address sampling circuits and row decoders 1-n0 are under the control of the respective row address sampling control signals RADSABb1-n.

The bit line sense amplifier driving circuits 1-n1 respectively generate N-sense amplifier driving signals LANGb1-n and P-sense amplifier driving signals LAPGb1-n which control the operations of the bit line sense amplifiers for the memory banks BANKb1-n responsive to the bit line sensing enable control signals SAEBb1-n. The word line driving circuits 1-n2 respectively generate the word line driving signals WLi1-n on receipt of the word line enable driving signals WLEi1-n that are generated by the respective row address sampling circuits and row decoders 1-n0.

A synchronous dynamic RAM may be synchronized at a rising edge of an external clock signal to provide a row active command to a memory bank. A row precharge command may then be given to another memory bank in response to a following external clock signal cycle. In addition, the synchronous dynamic random access memory may provide a row precharge command at a rising edge of the external clock signal.

In the memory device of FIG. 3 including a plurality of memory banks, the row address predecoder 30 and its output line 5 are shared among the plurality of memory banks BANKb1-n. When a row precharge command is provided to the memory bank BANKb2 at a clock cycle after a row active command has been given to the memory bank BANKb1, the sensing operation of the corresponding bit line sense amplifier responsive to the row active command following the preceding clock signal may become delayed. In addition, the row precharging operation for the other memory bank can be rapidly performed according to the row precharge command given during the following clock signal. To prevent one bank activation in response to the active command of the preceding clock signal from being disabled by the following clock signals precharge command given to another memory bank, each memory bank individually latches an output of the row address predecoder 30 according to a sampling method at the time of its row activation. A word line enable signal is then generated. Each of the memory banks has either a control signal RADSAB for precharging each row address sampling circuit and each row decoder at the time of precharge, or a signal SAEB for controlling the enabling/disabling of each bit line sense amplifier at the time of its row activation or precharge.

Figure 4:
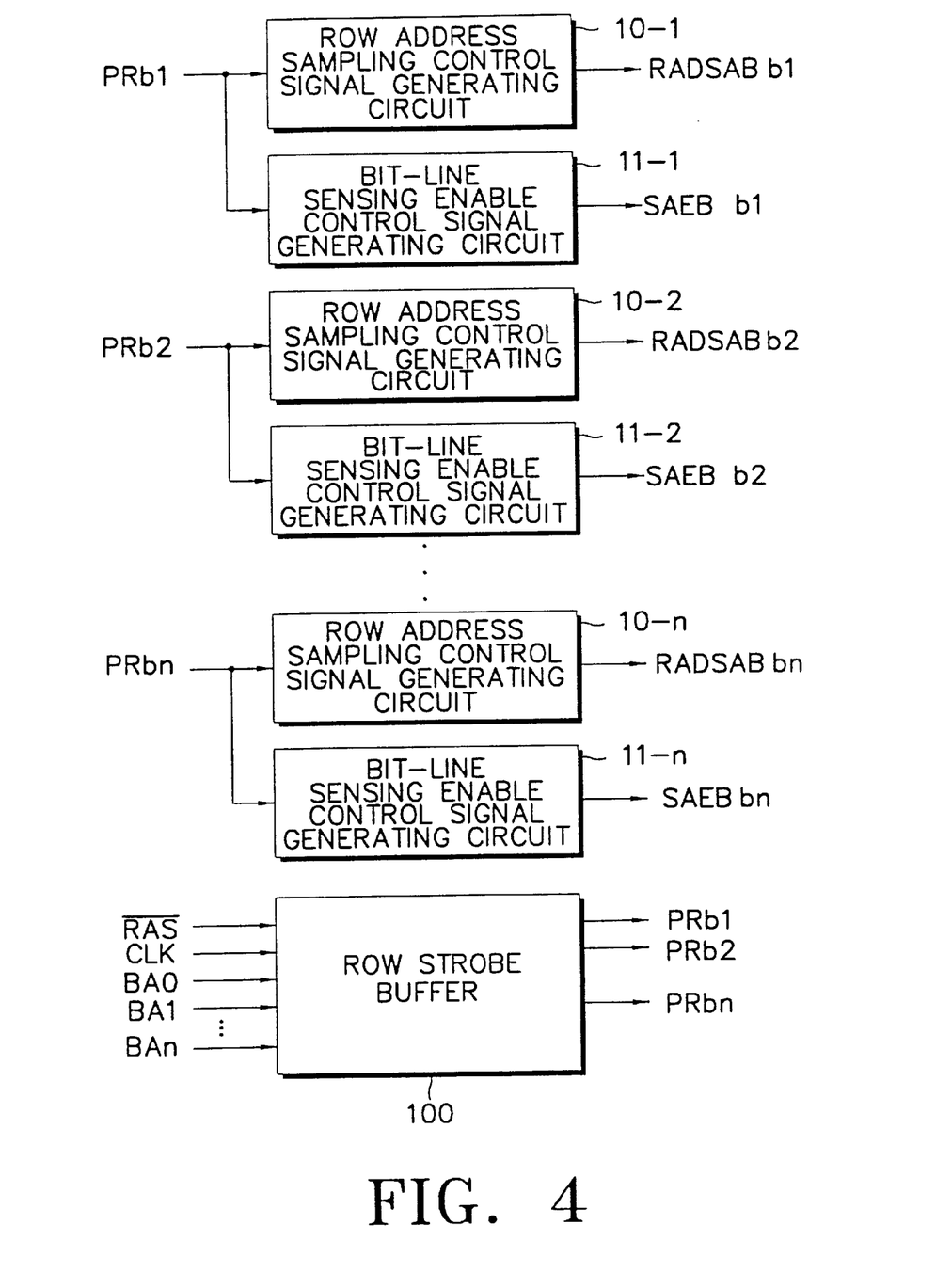
FIG. 4 is a block diagram of bank control signal generating circuits for a memory device having a multibank structure according to the present invention.

FIG. 4 is a block diagram of bank control signal generating circuits for a memory device having a multibank structure according to the present invention. The bank control signal generating circuits include row address sampling control signal generating circuits 10-1-n which respectively generate row address sampling signals RADSABb1-n on receipt of respective control signals PRb1-n. The bit line sensing enable control signal generating circuits 11-1-n each produce bit line sensing enable control signals SAEBb1-n upon receipt of the control signals PRb1-n. A row strobe buffer 100 generates the control signals PRb1-n in response to the generation of the complementary row address strobe signal $\overline{RAS}$, the clock signal CLK from an external clock, and the bank selection address signals BA0-n. The circuits discussed above will now be described in detail with reference to FIGS. 5, 6 and 7.

Figure 5:
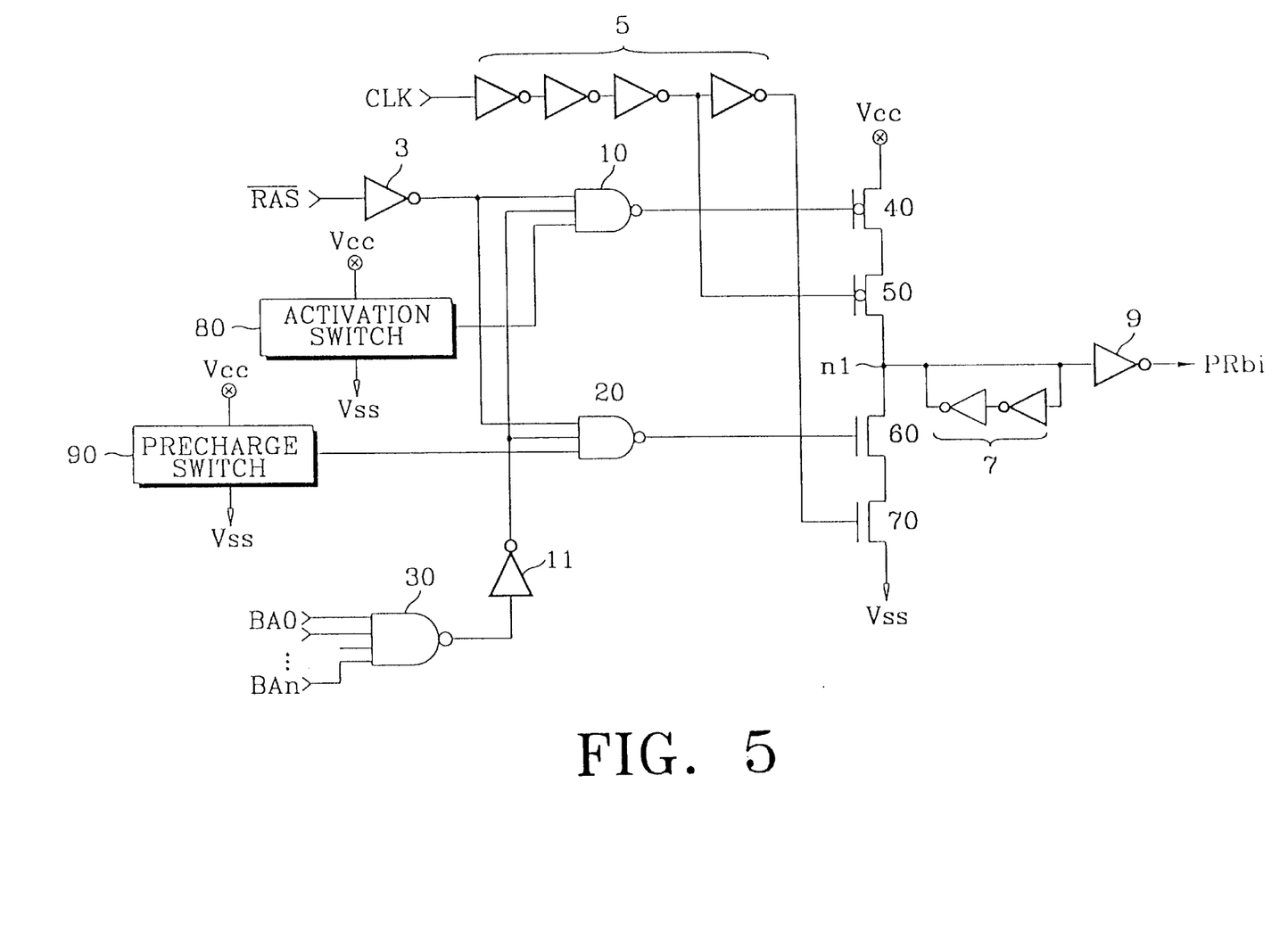
FIG. 5 is a circuit diagram of a first control signal generating circuit according to FIG. 3.

FIG. 5 is a circuit diagram of a first control signal generating circuit of FIG. 4. This first control signal generating circuit includes an inverter chain 5 with an even number of inverters which delays the clock signal CLK for a predetermined period of time. The clock signal is also inverted by providing a line from the transistor 50 to the output of the third inverter of the inverter chain 5. Each of the NAND gates 10 and 20 performs a NAND operation with respect to complementary row address strobe signal $\overline{RAS}$ which is inverted by the inverter 3. The activation switch 80 is coupled between the external supply voltage Vcc and ground Vss. The activation switch has an output terminal connected to one of the input terminals of the NAND gate 10 so as to be coupled to the external supply voltage Vcc when activating a corresponding word line, and coupled to the ground Vss when precharging the word line for switching.

The first control signal generating circuit also includes a precharge switch 90 which is coupled between the external supply voltage Vcc and the ground Vss. The precharge switch 90 has an output terminal connected to one of the input terminals of the NAND gate 20 so as to be coupled to the external supply voltage Vcc when activating a corresponding word line and so as to be coupled to the ground Vss when precharging the word line for switching. The NAND gate 30 performs a NAND operation with respect to each input bank selection address signal BA0-n, and the output of this NAND gate is inverted by the inverter 11 and provided to inputs of the NAND gates 10 and 20. The PMOS transistors 40 and 50 and the NMOS transistors 60 and 70 are coupled in series between the external supply voltage Vcc and ground Vss. These transistors have their respective gate terminals connected to the output of the NAND gate 10, the third inverter of the inverter chain 5, the output of NAND gate 20, and the output of the last inverter of the inverter chain 5.

The first control signal generating circuit further includes an inverter chain 7 that latches the signal produced at node n1 between the respective drain terminals of the PMOS transistor 50 and the NMOS transistor 60. In addition, an inverter 9 inverts the output of the inverter chain 7 and produces the first control signal PRbi. The first control signal PRbi has a logic "high" state when activating a corresponding word line, and the first control signal PRbi has a logic "low" state when precharging the word line.

Figure 6:
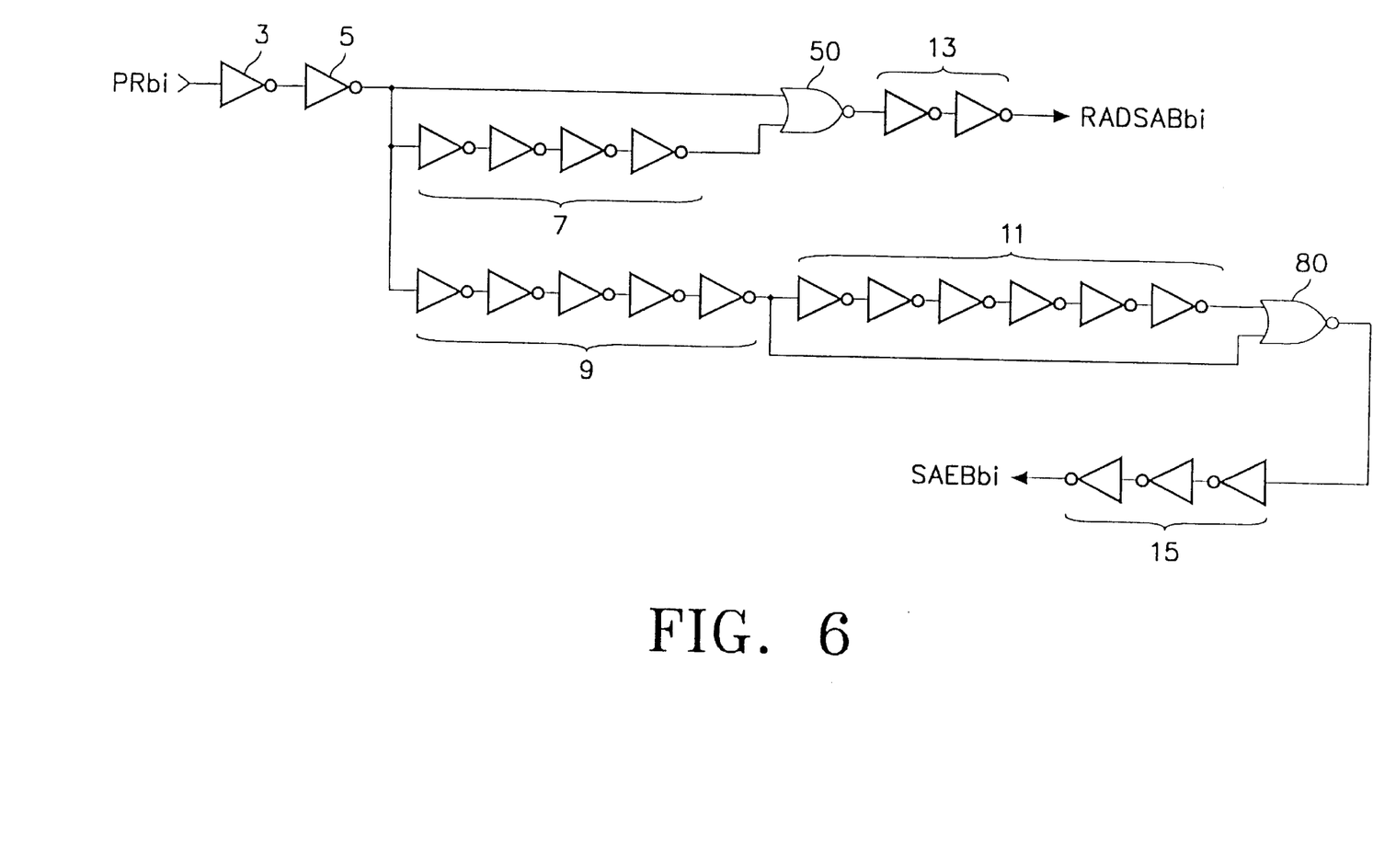
FIG. 6 is a circuit diagram of a row address sampling control signal generating circuit and a bit line sensing enable control signal generating circuit according to FIG. 4.

FIG. 6 is a circuit diagram illustrating the row address sampling control signal generating circuit and the bit line sensing enable signal generating circuit of FIG. 4. The first control signal PRbi is generated as the memory banks to be activated are determined, and is delayed for a predetermined period of time by the inverters 3 and 5. The output of the inverter 5 is applied directly to an input of the NOR gate 50. In addition, the output of the inverter 5 is provided to a second output of the NOR gate 50 through the inverter chain 7. The inverter chain 7 includes an even number of inverters to delay the signal applied to the second input terminal of the NOR gate 50. The output of the NOR gate 50 is delayed by the inverter chain 13, and the inverter chain 13 produces the row address sampling control signal RADSABbi.

The bit line sensing enable control signal generating circuit includes an inverter chain 9 with an odd number of inverters which delays and inverts the output of the inverter 5. The inverter chain 11 has an even number of inverters and delays the output signal of the inverter chain 9 for a predetermined period of time. The NOR gate 80 generates a logical product of the outputs of the inverter chains 9 and 11, and the inverter chain 15 delays and inverts the output of the NOR gate 80, to produce the bit line sensing enable control signal SAEBbi.

When activating a corresponding word line, the first control signal PRbi has a logic "high" state, and this high level signal is delayed by the inverters 3 and 5 for a predetermined period of time. A high level output signal is thus generated by the inverter 5 and applied to the first input terminal of the NOR gate 50. The high level output of the inverter 5 is also applied to the inverter chain 7, thus delaying the signal for a predetermined period of time. The inverter chain 7 has an even number of inverters so that a high level signal is provided to the second input terminal of the NOR gate 50. The NOR gate 50 thus performs a NOR operation with respect to the high level output signal of the inverter chain 7, producing a short pulse having a logic "low" state. The logic "low" level signal is delayed by the inverter chain 13 for a predetermined period of time, thereby producing the logic "low" row address sampling control signal RADSABbi.

Furthermore, the high level output signal of the inverter 5 is applied to the inverter chain 9 and delayed for a second predetermined period of time. The output of the inverter chain 9 is applied to an input terminal of the NOR gate 80, and the output of the inverter chain 9 is also provided to the inverter chain 11. A logic low level output signal is thus generated by the inverter chain 11 and provided to another input terminal of the NOR gate 80. The NOR gate 80 performs a NOR operation with respect to the low level signal and outputs a high level signal. This high level signal is then delayed for a predetermined period of time and inverted by the inverter chain 15. Accordingly, the inverter chain 15 produces the bit line sensing enable control signal SAEBbi which is at a logic "low" state.

The input first control signal has a logic "low" state when precharging a corresponding word line. Accordingly, the row address sampling control signal RADSABbi and the bit line sensing enable control signal SAEBbi are each generated as logic "high" level ones.

Figure 7:
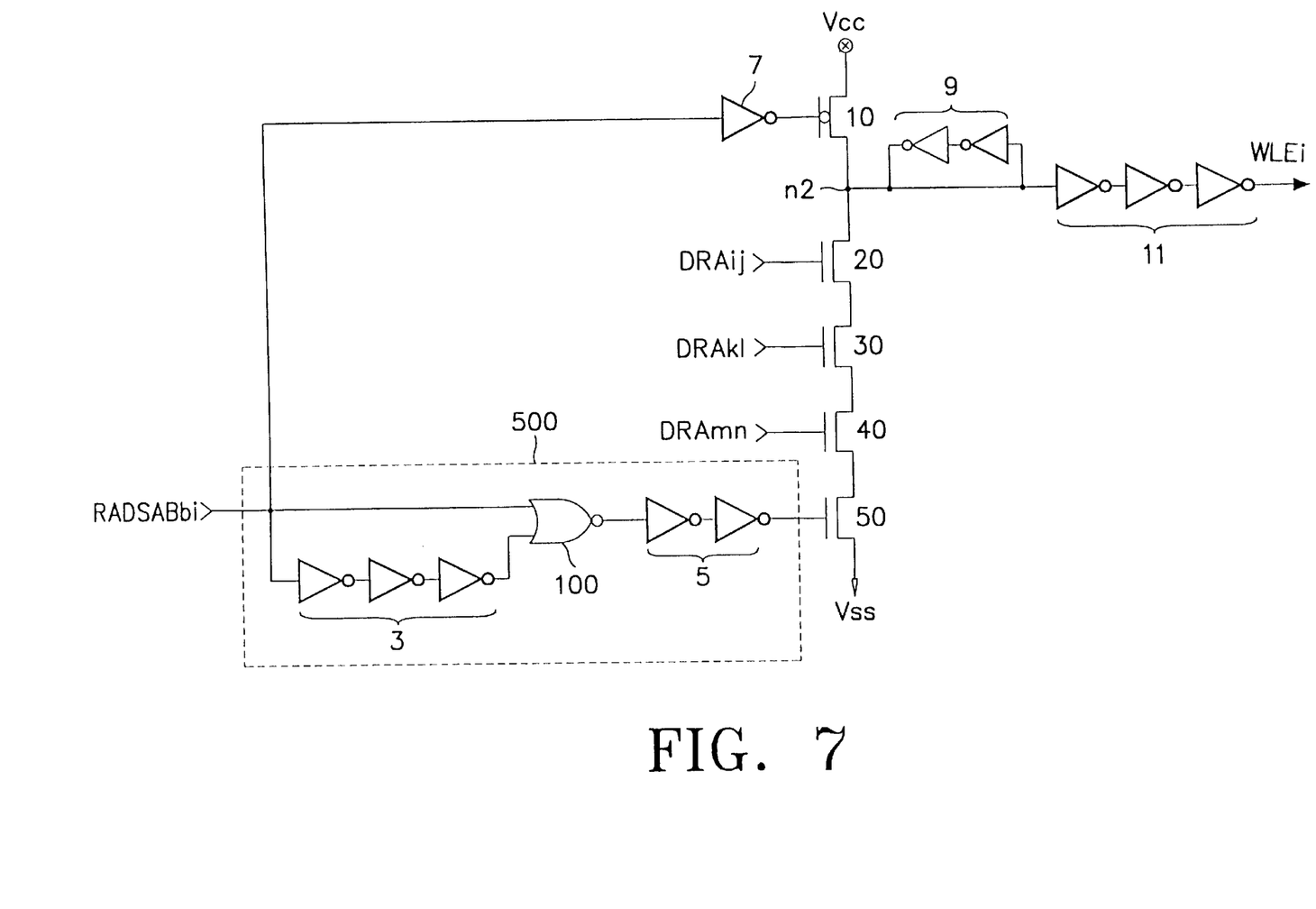
FIG. 7 is a circuit diagram of a row address sampling circuit and a row decoder according to FIG. 4.

FIG. 7 is a circuit diagram illustrating the row address sampling circuit and row decoder of FIG. 4. The row address sampling circuit 500 includes an inverter chain 3 which delays and inverts the row address sampling control signal RADSABbi generated by the row address sampling control signal generating circuit of FIG. 6. The NOR gate 100 receives the row address sampling control signal RADSABbi and the output of the inverter chain 3. In addition, the inverter chain 5 delays the output of the NOR gate 100 for a predetermined period of time.

The row decoder includes an inverter 7 which inverts the row address sampling control signal RADSABbi. The PMOS transistor 10 includes a gate connected to the output of the inverter 7, a source connected to the external supply voltage Vcc, and a drain connected to the node n2. The NMOS transistors 20, 30, 40 and 50 are coupled in series between the node n2 and the ground Vss, and each of these NMOS transistors has a respective gate which receives the row addresses DRAij, DRAkl and DRAmn which are generated by the row address predecoder. The gate of the NMOS transistor 50 is connected to the output of the inverter chain 5.

When activating a word line, the corresponding row address sampling control signal RADSABbi having a logic "low" state is input into the row address sampling circuit 500. This signal is delayed for a predetermined period of time, and a short pulse having a logic "high" state is generated by the row address sampling circuit 500. When each of the row addresses DRAij, DRAkl and DRAmn, which are generated by the row address predecoder, have a logic "high" state, the NMOS transistors 20, 30, 40 and 50 turn on, and the logic "high" level signal is provided to the gate of the PMOS transistor 10 by the inverter 7, the PMOS transistor turns off so that the node n2 is at the logic "low" state.

The inverter chain 9 latches the output of the node n2 which is now at the logic "low" state as discussed above, and the inverter chain 11 delays and inverts the output of the node n2 to generate the word line enable control signal WLEi which has a logic "high" state.

When precharging the word line, the row address sampling control signal RADSABbi has a logic "high" state and is provided to the row address sampling circuit 500. The row address sampling circuit 500 is turned on to a produce a logic "low" level signal which is provided to the NMOS transistor 50. The NMOS transistor 50 thus turns off, and the RADSABbi signal is inverted by the inverter 7 so that a logic "low" level signal is provided to the gate of the PMOS transistor 10. Accordingly, the PMOS transistor 10 turns on. The node n2 thus has a logic "high" state which is determined by a difference between the external supply voltage Vcc and a threshold voltage of the PMOS transistor 10. The inverter chain 9 latches the output of the node n2 which now has the logic "high" state, and the inverter chain 11 delays and inverts the output of the inverter chain 9 to produce a word line enable control signal WLEi having a logic "low" state.

Figure 8:
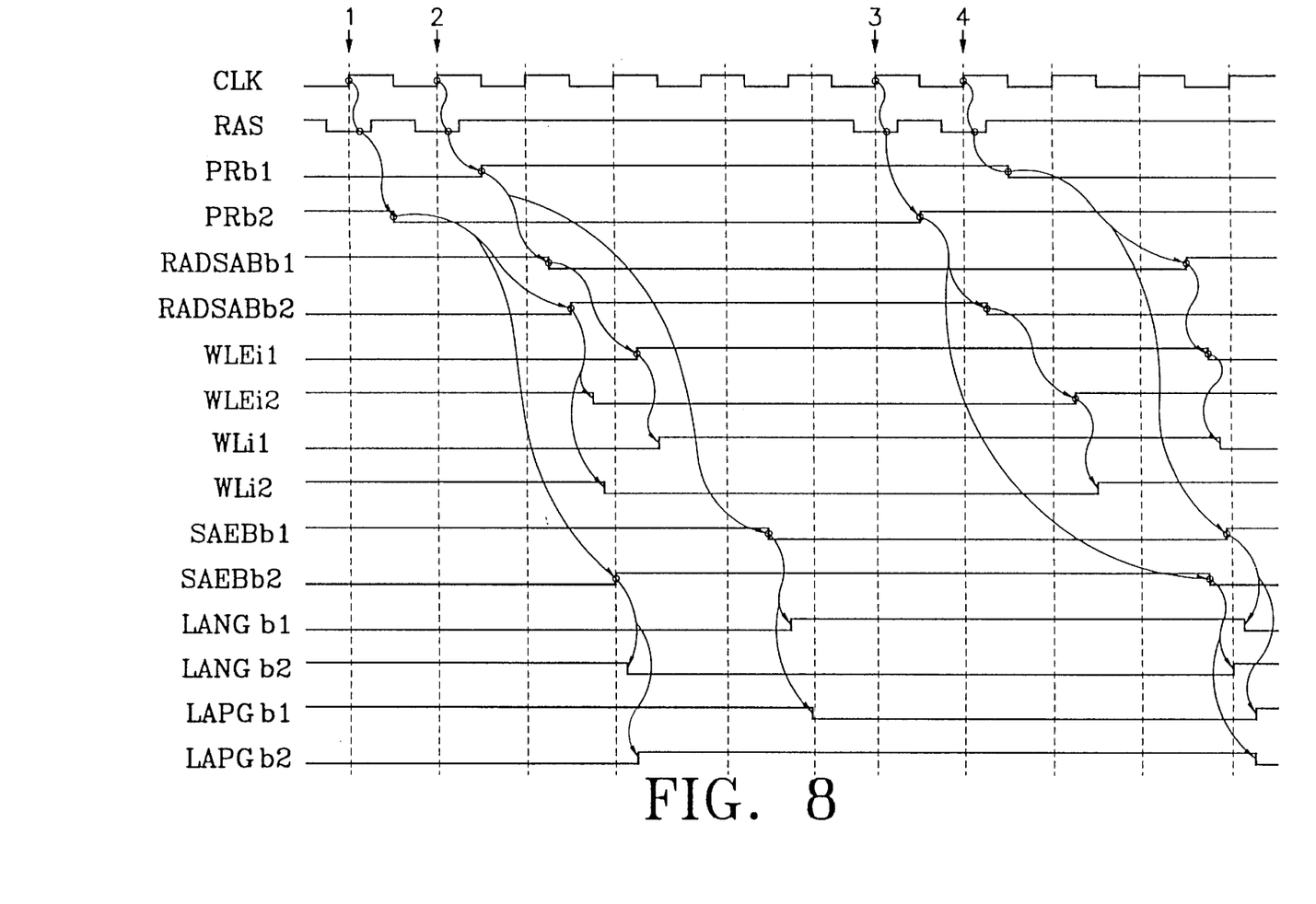
FIG. 8 is a timing diagram illustrating row activating and precharging of the memory device of FIG. 3.

FIG. 8 is a timing diagram illustrating the operation of the memory device of FIG. 3 during the operations of row activating/precharging the memory banks. The reference CLK represents a system clock, and the row address sampling control signals RADSABb1-2 are enabled to have the logic "low" state by each of the control signals PRb1-2 in response to row active commands during clock signals 2 and 3 so that a valid row address is provided to the output line of the row address predecoder. A pulse having a logic "high" state is then generated by the row address sampling circuit 500 of FIG. 7 so that the corresponding word line enable control signal WLEi has a logic "high" state. Accordingly, the word line corresponding to the address is driven to a logic "high" state. Responding to the clock signals 2 and 3, the bit line sensing enable signals SAEBb1 and SAEBb2 are delayed beyond the transition of the respective signals PRb1 and PRb2 so that the bit line sensing enable signals are delayed beyond the respective word line enable signals WLEi. The bit line sensing enable signals SAEBb1 and SAEBb2 are enabled to logic "low" states so that the N/P sense amplifier driving signals LANG and LAPG are respectively at logic "high" and "low" states to begin sensing operations.

When a row precharge command is provided in response to clock signals 1 and 4, each of the control signals PRb1 and PRb2 has a logic "low" state, and each one of the signals PADSABb1 and PADSABb2 are driven to the logic "high" state in response to the signals PRb1 and PRb2 so that the row decoder is precharged to a logic "high" level. Each of the signals WLEi1 and WLEi2 is disabled to a logic "low" state and the corresponding word lines WLi are disabled to the logic "low" state. In addition, each bit line sensing enable signal SAEBb1 and SAEBb2 has a logic "high" state in response to the logic "low" state of the control signals PRb1 and PRb2. The N/P sense amplifier driving signals LANG and LAPG are at respective logic "low" and "high" states, thereby disabling the bit line sense amplifier.

An integrated circuit memory device having a plurality of memory banks sharing a single row address predecoder and its output line may thus control the word line activating/precharging operations and the operating time of the bit line sense amplifier, thereby reducing access times.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:

a plurality of memory banks wherein each of said memory banks includes a plurality of memory cells, a plurality of bit lines running along said memory cells, and a bit line sense amplifier connected to said bit lines for sensing and amplifying data of said memory cells;

a row address predecoder which decodes row address signals in response to a system clock;

a row strobe buffer which generates a control signal selecting corresponding memory banks in response to said system clock, a row address strobe signal, and a bank selection address signal;

at least one row address sampling control circuit which generates a row address sampling control signal in a predetermined period of time in response to said first control signal wherein said row address sampling control signal controls word-line activating and precharging operations; and a row decoder which latches a decoded row address signal generated by said row address predecoder in response to said row address sampling control signal.

2. An integrated circuit memory device according to claim 1 wherein said at least one row address sampling control circuit comprises a plurality of row address sampling control circuits each corresponding to a respective memory bank.

3. An integrated circuit memory device according to claim 1 wherein said row strobe buffer comprises:

an activation switch which controls said control signal so that said control signal having a logic "high" state can be generated during word-line activation; and a precharge switch which controls said control signal so that said control signal having a logic "low" state can be generated during word-line precharging operation.

4. An integrated circuit memory device according to claim 1 wherein said row address sampling control circuit produces said row address sampling control signal during said word-line precharging operation to precharge a corresponding word line by a word-line enable signal, and to disable a bit-line sensing enable control signal.

5. An integrated circuit memory device comprising:

a plurality of memory banks wherein each of said memory banks includes a plurality of memory cells, a plurality of bit lines running along said memory cells, and a bit line sense amplifier connected to said bit lines for sensing and amplifying data of said memory cells;

a row address predecoder which decodes row address signals in response to a system clock;

a row strobe buffer which generates a control signal to select a corresponding memory bank in response to a system clock, a row address strobe signal, and a bank selection address signal;

a row address sampling control circuit which generates a row address sampling control signal in a predetermined period of time in response to said control signal generated by said row strobe buffer to control word-line activating and precharging operations; and a bit-line sensing enable control circuit which regulates enabling and disabling of a bit-line sense amplifier in response to said control signal, and which generates a bit-line sensing enable control signal which is delayed after said row address sampling control signal.

* * * * *